United States Patent [19]

Masuda

[11] Patent Number: 5,785,762
[45] Date of Patent: Jul. 28, 1998

[54] EXTERNAL COMBUSTION OXIDATION APPARATUS

[75] Inventor: Shuichi Masuda, Tokyo, Japan

[73] Assignee: NEC Corporation, Tokyo, Japan

[21] Appl. No.: 900,843

[22] Filed: Jul. 25, 1997

[30] Foreign Application Priority Data

Jul. 25, 1996 [JP] Japan ................. 8-196082

[51] Int. Cl.$^6$ ........................... C23C 16/00
[52] U.S. Cl. ................ 118/666; 118/708; 118/712; 118/719
[58] Field of Search .................. 118/666, 708, 118/712, 719

[56]  References Cited

FOREIGN PATENT DOCUMENTS 60-186023  9/1985  Japan .
1-319940  12/1989  Japan .

Primary Examiner—Richard Bueker

[57]  ABSTRACT

An external combustion oxidation apparatus includes a furnace core tube, a mixing chamber, a heater, a gas inlet tube, a temperature detector, and a temperature controller. In the furnace core tube, a semiconductor wafer is accommodated in a gas mixture atmosphere of water vapor and a dilute gas. The furnace core tube is heated to a predetermined temperature to form an oxide film on the semiconductor wafer. The mixing chamber mixes water vapor and the dilute gas and supplies a gas mixture into the furnace core tube. The heater heats the mixing chamber. The gas inlet tube connects the mixing chamber and the furnace core tube to each other. The temperature detector detects a temperature in the furnace core tube. The temperature controller controls a heating operation of the heater based on the temperature in the furnace core tube which is detected by the temperature detector.

8 Claims, 9 Drawing Sheets

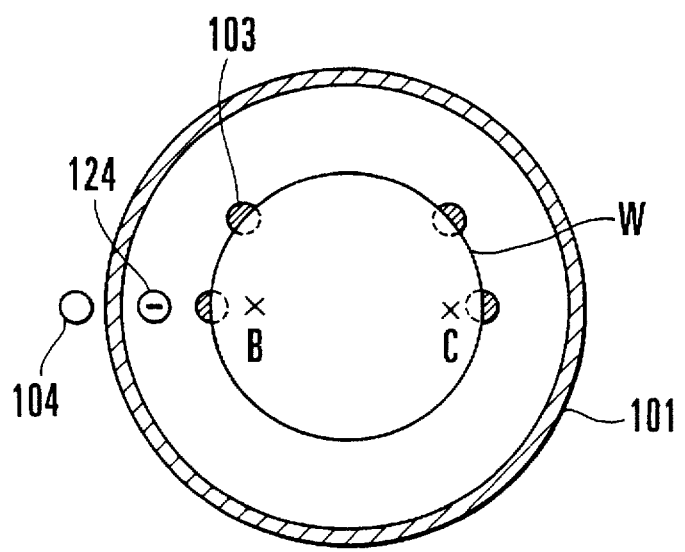
F I G. 2

1

EXTERNAL COMBUSTION OXIDATION APPARATUS

BACKGROUND OF THE INVENTION

The present invention relates to an external combustion oxidation apparatus for forming an oxide film on a semiconductor wafer by thermal oxidation and, more particularly, to an external combustion oxidation apparatus that uniforms the thickness of an oxide film formed on a semiconductor wafer.

An apparatus for mixing a dilute gas in water vapor and thermally oxidizing the mixture in order to form an oxide film on a semiconductor wafer is disclosed in, e.g., Japanese Patent Laid-Open Nos. 60-186023, 1-319940. For example, an apparatus disclosed in Japanese Patent Laid-Open No. 1-319940 forms an oxide film on semiconductor wafers W with a horizontal external combustion oxidation apparatus as shown in FIG. 5.

Referring to FIG. 5, a furnace core tube 1 made of, e.g., silica glass, is horizontally installed in the external combustion oxidation apparatus, and a heater 2 surrounds the furnace core tube 1 whose interior is heated to 700° C. to 1,200° C. A large number of semiconductor wafers W vertically held on a boat 3 are loaded in and unloaded from the furnace core tube 1 through an inlet/outlet port 1a at one end portion of the furnace core tube 1.

The other end portion of the furnace core tube 1 is connected to a mixing chamber 5 through a gas inlet tube 4. A dilute gas supply tube 6 for supplying a dilute gas of, e.g., Ar, $N_2$, or $O_2$, is introduced into the mixing chamber 5, and a combustion chamber 7 for generating water vapor is formed to separate from the mixing chamber 5. An oxygen supply tube 8 and a hydrogen supply tube 9 are led into the combustion chamber 7. Water vapor is generated in the combustion chamber 7 from oxygen and hydrogen supplied from the supply tubes 8 and 9, respectively. A side surface of the combustion chamber 7 that opposes the wall surface of the mixing chamber 5 is formed with a water vapor outlet port 7a for discharging the water vapor into the mixing chamber 5.

In the external combustion oxidation apparatus having the above arrangement, an oxide film is formed on the semiconductor wafers W in the following manner. Oxygen gas and hydrogen gas are supplied into the combustion chamber 7 from the oxygen supply tube 8 and the hydrogen supply tube 9, respectively, and are mixed. The gas mixture ignites to burn, thus generating water vapor in the combustion chamber 7. The water vapor flows into the mixing chamber 5 through the water vapor outlet port 7a. A low-temperature dilute gas is supplied into the mixing chamber 5 through the dilute gas supply tube 6, and the water vapor and the dilute gas are mixed and diffused in the mixing chamber 5. The mixed water vapor and dilute gas are supplied into the furnace core tube 1 through the gas inlet tube 4. Because of thermal oxidation caused by the water vapor, an oxide film is formed on the large number of semiconductor wafers W loaded in the furnace core tube 1. At this time, the thickness of the oxide film formed on the semiconductor wafers W becomes thin because of the dilute gas.

A vertical external combustion oxidation apparatus (first conventional vertical apparatus) which is an improvement over the horizontal external combustion oxidation apparatus described above has been proposed.

In the first conventional vertical apparatus, as shown in FIG. 6, a furnace core tube 11 made of, e.g., silica glass, is installed vertically. The furnace core tube 11 is surrounded by a heater 12, and its interior is heated to 700° C. to 1,200° C. A large number of semiconductor wafers W horizontally held on a boat 13 are loaded in and unloaded from the furnace core tube 11 through an inlet/outlet port 11a formed at the lower end portion of the furnace core tube 11.

One thin gas inlet tube 14 extends between the furnace core tube 11 and heater 12, and a discharge port 14a of the gas inlet tube 14 is arranged in the upper end portion of the furnace core tube 11. The other end portion 14b of the gas inlet tube 14 is connected to a dilute gas supply tube 16 and a combustion chamber 17. The combustion chamber 17 is connected to an oxygen supply tube 18 and a hydrogen supply tube 19 for supplying oxygen gas and hydrogen gas, respectively. The gas mixture of the oxygen gas and hydrogen gas in the combustion chamber 17 is heated by a heater 21 to a temperature equal to or higher than the ignition point of hydrogen, to generate water vapor. The water vapor from the combustion chamber 17 and a dilute gas supplied from the dilute gas supply tube 16 are mixed at an intermediate portion 14c of the gas inlet tube 14. The intermediate portion 14c of the gas inlet tube 14 is heated by a heater 22 to 100° C. to 200° C. so that the heated water vapor will not cause dewing due to the low-temperature dilute gas.

The first conventional apparatus has the above arrangement, and forms an oxide film on the semiconductor wafers W by thermal oxidation caused by the water vapor. In the first conventional apparatus, oxygen and hydrogen are supplied into the combustion chamber 17 to generate water vapor. The generated water vapor and the supplied dilute gas are not mixed in a mixing chamber but are directly supplied into the furnace core tube 11 through the gas inlet tube 14. In addition, because of the two heaters 12 and 22, the water vapor and the dilute gas are supplied into the furnace core tube 11 without being cooled.

A vertical external combustion oxidation apparatus (second conventional vertical apparatus) which is an improvement over the first conventional apparatus has also been proposed.

In the second conventional vertical apparatus, as shown in FIG. 7, a vertical furnace core tube 11 is surrounded by a heater 12, in basically the same manner as in the first conventional apparatus. A vessel 23 is connected to the other end portion 14b of a gas inlet tube 14, and the interior of the vessel 23 is partitioned into a combustion chamber 27 and a mixing chamber 25 by a silica partition plate 24. A hydrogen outlet port 24a is formed in the partition plate 24. Water vapor generated in the combustion chamber 27 flows into the mixing chamber 25 through the hydrogen outlet port 24a. The combustion chamber 27 is connected to an oxygen supply tube 18 and a hydrogen supply tube 19 to generate water vapor in it. In order to generate the water vapor, the interior of the combustion chamber 27 is heated by a heater 21 to a temperature equal to or higher than the ignition point of hydrogen. The mixing chamber 25 is connected to the other end portion 14b of the gas inlet tube 14 and a dilute gas supply tube 16.

The second conventional apparatus has the above arrangement. In the same manner as in the first conventional apparatus, an oxide film is formed on semiconductor wafers W by thermal oxidation caused by the water vapor. The second conventional apparatus is different from the first conventional apparatus in that the water vapor generated in the combustion chamber 27 flows into the mixing chamber 25 through the hydrogen outlet port 24a and is mixed with the dilute gas in the mixing chamber 25, and that the gas mixture is supplied from the gas inlet tube 14 into the furnace core tube 11.

In the first and second conventional apparatuses, the gas inlet tube 14 extends between the furnace core tube 11 and the heater 12. This prevents the water vapor and dilute gas flowing in the gas inlet tube 14 from being cooled, and decreases the installation space. Accordingly, the temperature in the furnace core tube 11 on a side where the gas inlet tube 14 is arranged is lower than the temperature in the furnace core tube 11 on a side remote from the gas inlet tube 14. Hence, a temperature difference occurs on the surface of each semiconductor wafer W in the furnace core tube 11. As a result, a thickness difference occurs in the oxide film.

For example, FIG. 9 shows a difference in thickness of the oxide film formed on the semiconductor wafer at a position E close to the gas inlet tube 14 and a position F separate from the gas inlet tube 14 in FIG. 8 which is a sectional view taken along the line D—D of FIG. 6. FIG. 9 is a graph in which the position in the furnace core tube 1 is plotted along the axis of abscissa and the difference (the unit is arbitrary) in thickness of the oxide film at this position is plotted along the axis of ordinate. FIG. 9 shows the difference in thickness of the oxide film in accordance with the flow rates of the dilute gas. More specifically, FIG. 9 is a graph showing the difference in thickness of the oxide film within the surface of the semiconductor wafer W by indicating a certain flow rate a of the dilute gas by ●, the flow rate 5×a, which is 5 times the flow rate a, by ▲, and the flow rate 10×a, which is 10 times the flow rate a, by ■. From this graph, the larger the flow rate of the dilute gas, the larger the difference in thickness of the oxide film. It is also apparent that with any flow rate, the difference in thickness of the oxide film appears more remarkably at the lower end portion (BOTTOM), which corresponds to the inlet/outlet port 1a, than at the upper end portion (TOP) of the furnace core tube 1.

The larger the flow rate of the dilute gas, the larger the difference in thickness of the oxide film within the surface of the semiconductor wafer W. This may be because, when the flow rate of the dilute gas increases, the dilute gas is not sufficiently heated by the heater 12, but flows into the furnace core tube 1 in a cooled state. A difference in thickness of the oxide film is small at the upper end portion in the furnace core tube 11. This may be because the dilute gas is heated at the upper end portion in the furnace core tube 11.

In this manner, the thickness of the oxide film formed on the semiconductor wafer W varies not only within the surface of the wafer W but also depending on the position in the furnace core tube 11. If the thickness of the oxide film varies, the quality of the semiconductor devices manufactured from the semiconductor wafer becomes non-uniform, leading to a decrease in yield.

SUMMARY OF THE INVENTION

It is an object of the present invention to provide an external combustion oxidation apparatus in which the temperature of a gas mixture flowing in a gas inlet tube is prevented from influencing a semiconductor wafer, so that a difference in thickness of an oxide film formed on the semiconductor wafer is decreased.

In order to achieve the above object, according to the present invention, there is provided an external combustion oxidation apparatus comprising a furnace core tube which accommodates a semiconductor wafer in a gas mixture atmosphere of water vapor and a dilute gas and which is heated to a predetermined temperature to form an oxide film on the semiconductor wafer, a mixing chamber for mixing water vapor and the dilute gas and supplying a gas mixture into the furnace core tube, first heating means for heating the mixing chamber, a gas inlet tube for connecting the mixing chamber and the furnace core tube to each other, temperature detection means for detecting a temperature in the furnace core tube, and temperature control means for controlling a heating operation of the first heating means based on the temperature in the furnace core tube which is detected by the temperature detection means.

BRIEF DESCRIPTION OF THE DRAWINGS

FIG. 2 is a sectional view taken along the line A—A of FIG. 1;

DESCRIPTION OF THE PREFERRED EMBODIMENT

The present invention will be described in detail with reference to the accompanying drawings.

Figure 1:
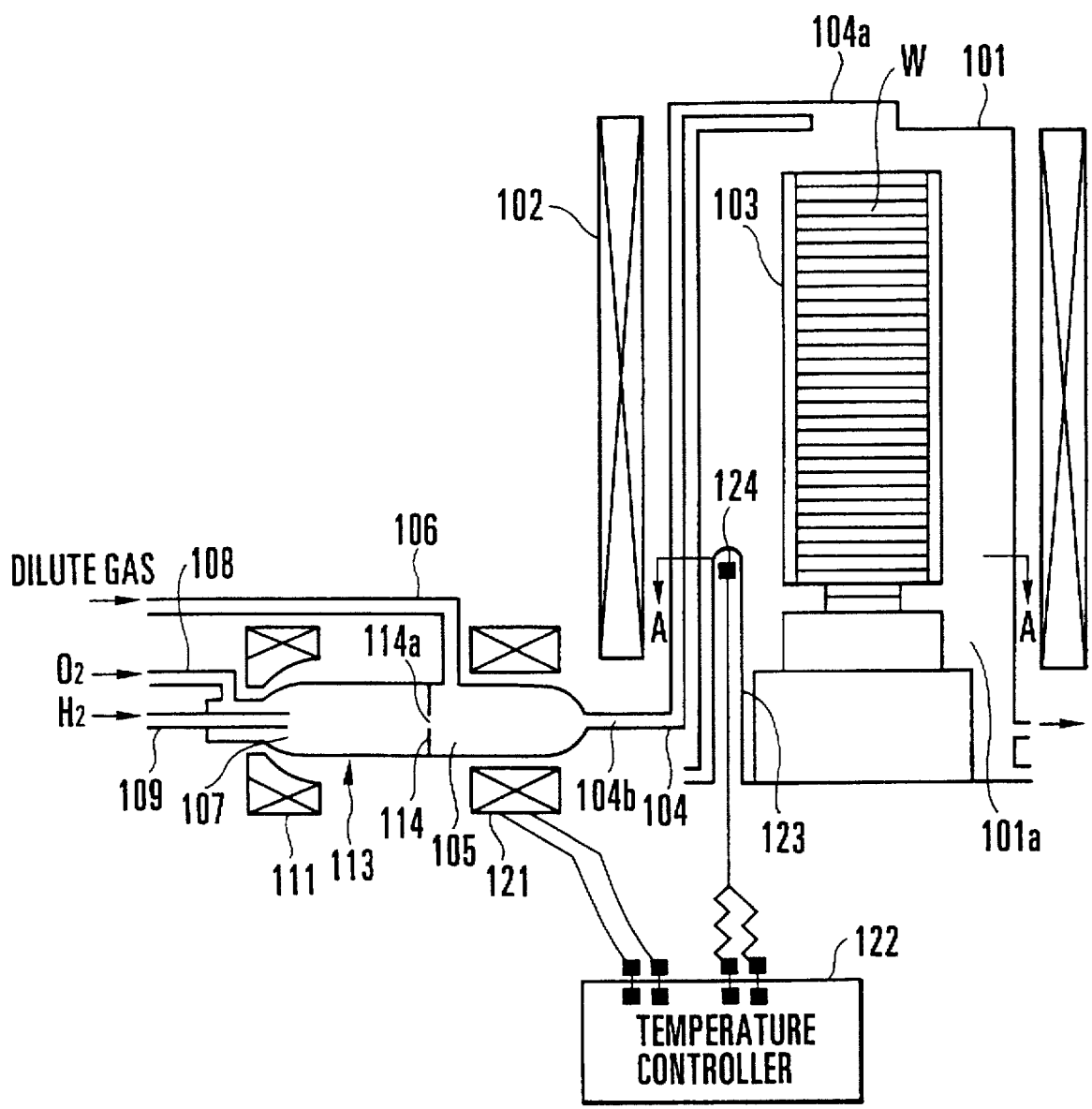
FIG. 1 is a view showing the schematic arrangement of an external combustion oxidation apparatus according to an embodiment of the present invention.

FIG. 1 shows the schematic arrangement of an external combustion oxidation apparatus according to an embodiment of the present invention. Referring to FIG. 1, reference numeral 101 denotes a furnace core tube made of, e.g., silica glass, and installed vertically. The furnace core tube 101 is surrounded by a heater 102 so that the interior of the tube 101 is heated to 700° C. to 1,200° C. A large number of horizontally held semiconductor wafers W are loaded in and unloaded from the furnace core tube 101 through an inlet/outlet port 101a at the lower end portion of the furnace core tube 101. One thin gas inlet tube 104 extends between the furnace core tube 101 and heater 102, and a discharge port 104a of the gas inlet tube 104 is arranged at the upper portion in the furnace core tube 101. A vessel 113 is partitioned into a mixing chamber 105 and a combustion chamber 107 by a partition plate 114. The other end portion 104b of the gas inlet tube 104 is connected to the mixing chamber 105 of the vessel 113. The mixing chamber 105 is connected to a dilute gas supply tube 106. Water vapor generated in the combustion chamber 107 flows into the mixing chamber 105 through a water vapor outlet port 114a.

The apparatus of this embodiment further has a heater 121, a temperature detector 124, and a temperature controller 122. The heater 121 heats the mixing chamber 105. The temperature detector 124 detects the temperature in the furnace core tube 101. The temperature controller 122 is connected to the heater 121 and the temperature detector 124, and controls the heating operation of the heater 121 based on the temperature in the furnace core tube 101 which is detected by the temperature detector 124.

The temperature detector 124 is constituted by, e.g., a thermocouple arranged in a silica glass tube 123 projecting into the furnace core tube 101. In order to detect the temperature of a portion of the furnace core tube 101 which is largely influenced by the temperature of the gas mixture flowing in the gas inlet tube 104, the temperature detector 124 is arranged between the gas inlet tube 104 in the furnace core tube 101 and the semiconductor wafers W, e.g., at the lower portion in the furnace core tube 101 near the gas inlet tube 104. The temperature controller 122 controls the temperature of the heater 121 that heats the mixing chamber 105, so that the temperature in the furnace core tube 101 becomes a desired oxidation temperature.

The combustion chamber 107 formed by partitioning the interior of the vessel 113 by the partition plate 114 is connected to an oxygen supply tube 108 for supplying oxygen and a hydrogen supply tube 109 for supplying hydrogen. The interior of the combustion chamber 107 is heated by a heater 111 to a temperature equal to or higher than the ignition point of hydrogen.

The operation of forming an oxide film on the semiconductor wafer W by the external combustion oxidation apparatus having the above arrangement will be described.

Oxygen gas and hydrogen gas are supplied into the combustion chamber 107 through the oxygen supply tube 108 and the hydrogen supply tube 109, respectively, and are mixed. The gas mixture in the combustion chamber 107 is heated by the heater 111 to a temperature equal to or higher than the ignition point of hydrogen, to generate water vapor. The water vapor generated in the combustion chamber 107 is supplied to the mixing chamber 105 through the water vapor outlet port 114a, and is mixed in the mixing chamber 105 with a dilute gas supplied through the dilute gas supply tube 106. The water vapor and dilute gas in the mixing chamber 105 are heated by the heater 121 to a predetermined oxidation temperature, and are supplied into the furnace core tube 101 through the gas inlet tube 104. In the furnace core tube 101, an oxide film is formed on the large number of semiconductor wafers W by thermal oxidation caused by the water vapor.

At this time, a signal representing the temperature of the furnace core tube 101 is input to the temperature controller 122 from the temperature detector 124 arranged in the furnace core tube 101. When the temperature in the furnace core tube 101 is lower than the predetermined oxidation temperature, the temperature controller 122 operates the heater 121, thereby increasing the temperature in the mixing chamber 105. The water vapor and the dilute gas are thus heated to a higher temperature and supplied into the furnace core tube 101.

Inversely, when the temperature in the furnace core tube 101 is lower than the predetermined oxidation temperature, the temperature controller 122 stops operating the heater 121, thereby decreasing the temperature in the mixing chamber 105. The water vapor and the dilute gas at a low temperature are thus supplied into the furnace core tube 101.

Since the temperature controller 122 adjusts the temperature in the mixing chamber 105, in this manner, the semiconductor wafers W in the furnace core tube 101 are not influenced by the temperature of the gas mixture flowing in the gas inlet tube 104, and the temperature difference on each semiconductor wafer W is eliminated.

Figure 3:
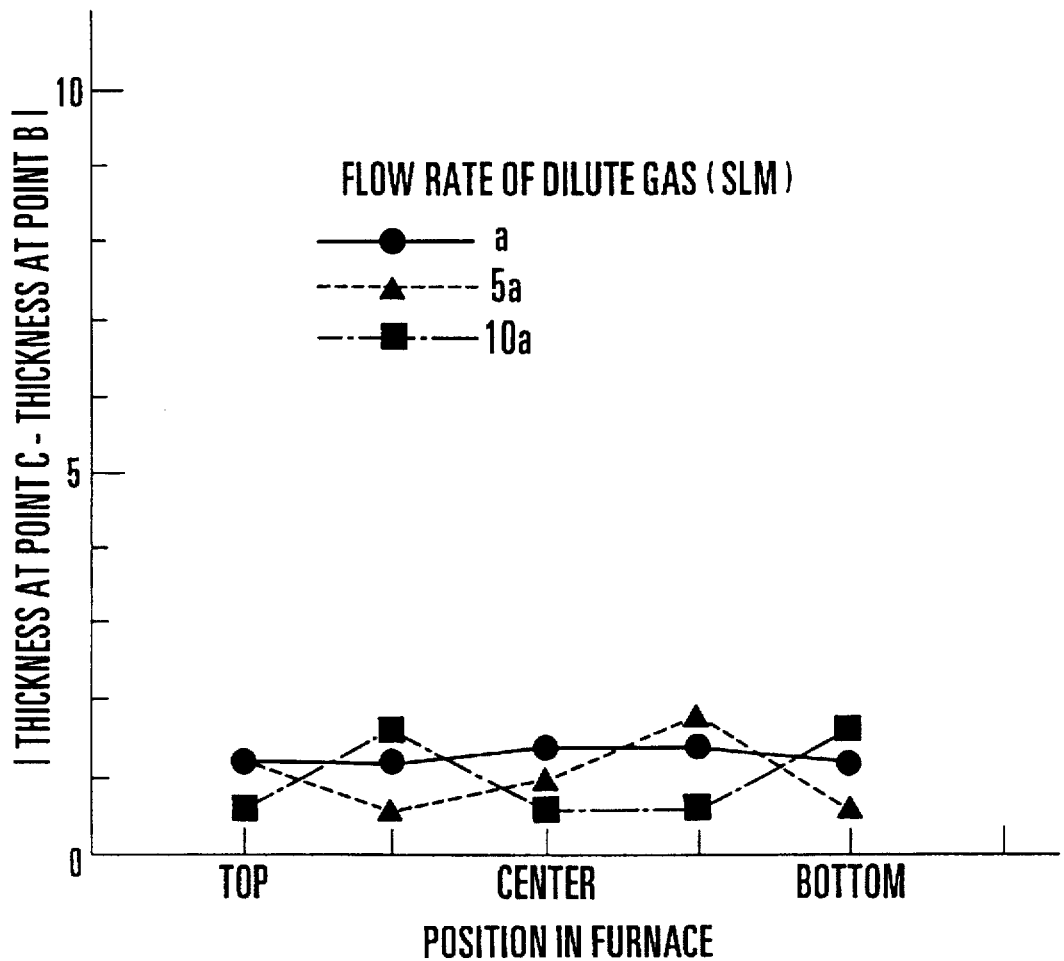
FIG. 3 is a graph showing a difference in thickness of the oxide film of a semiconductor wafer manufactured by the external combustion oxidation apparatus shown in FIG. 1.

FIG. 3 shows a difference in thickness of the oxide film formed on each semiconductor wafer W at a position B close to the gas inlet tube 104 and a position C separate from the gas inlet tube 104 in FIG. 2 which is a sectional view taken along the line A—A of FIG. 1. FIG. 3 is a graph showing the difference in thickness (the unit is arbitrary) of the oxide film at positions ranging from the upper end portion (TOP) in the furnace core tube 101 to the lower end portion (BOTTOM), which is the inlet/outlet port 101a, in accordance with three different dilute gas flow rates.

As is apparent from this graph, with the external combustion oxidation apparatus according to the present invention, since the temperature difference on each semiconductor wafer W is eliminated, the thickness difference on the oxide film formed on each semiconductor wafer W can be decreased. It is also apparent that the oxide film is formed substantially uniformly regardless of the flow rate of the dilute gas and the position in the furnace core tube 101, i.e., whether the oxide film is at the upper end portion or lower end portion in the furnace core tube 101.

Figure 4:
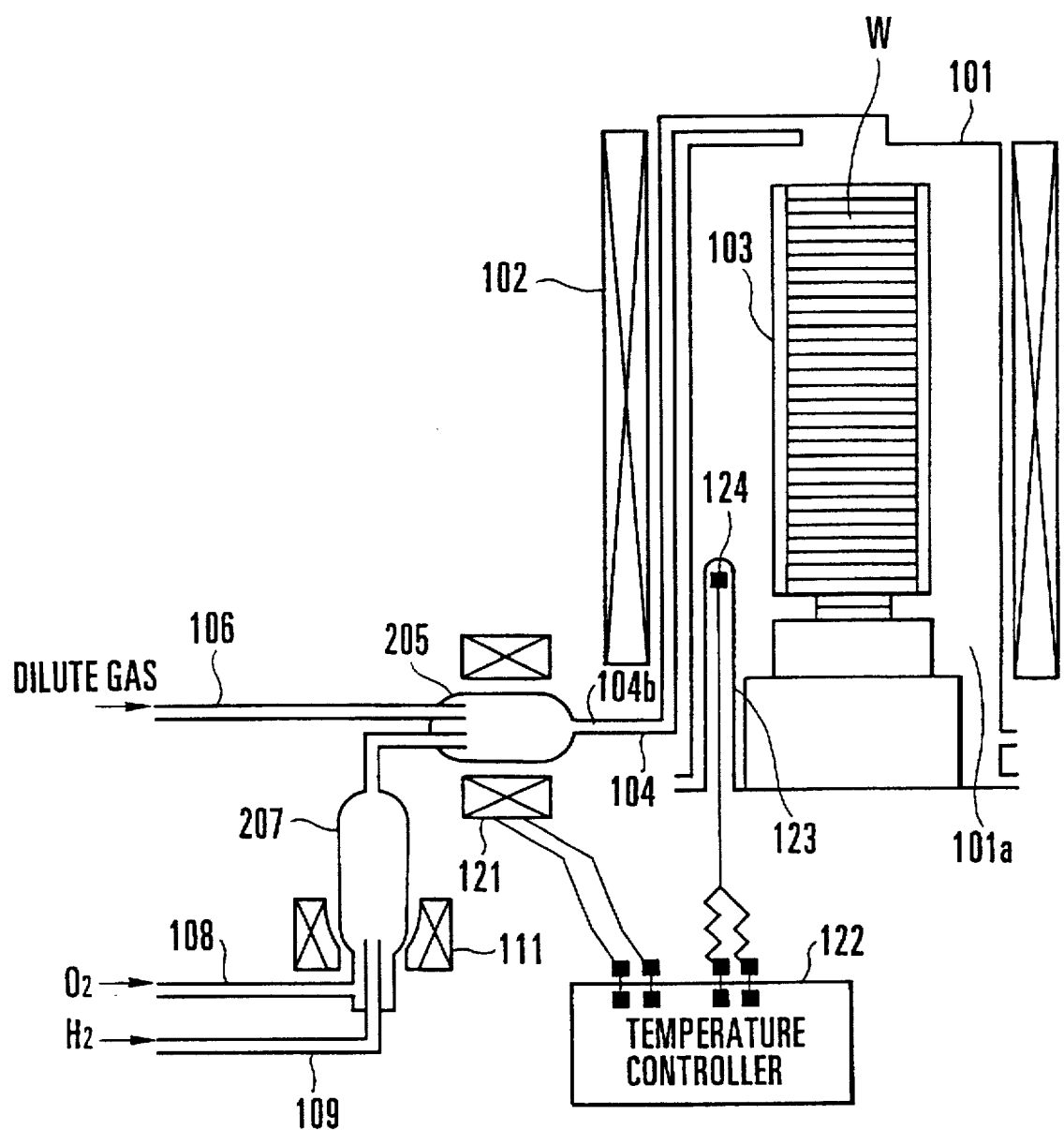
FIG. 4 is a view showing the schematic arrangement of a modification of the external combustion oxidation apparatus shown in FIG. 1.
Figure 5:
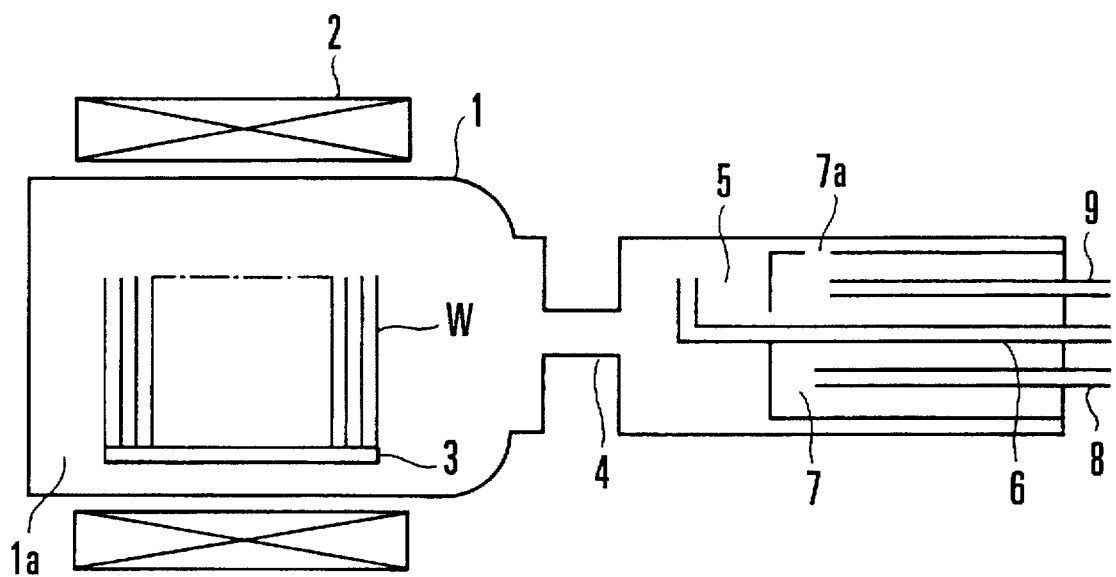
FIG. 5 is a view showing the schematic arrangement of a conventional horizontal external combustion oxidation apparatus.
Figure 6:
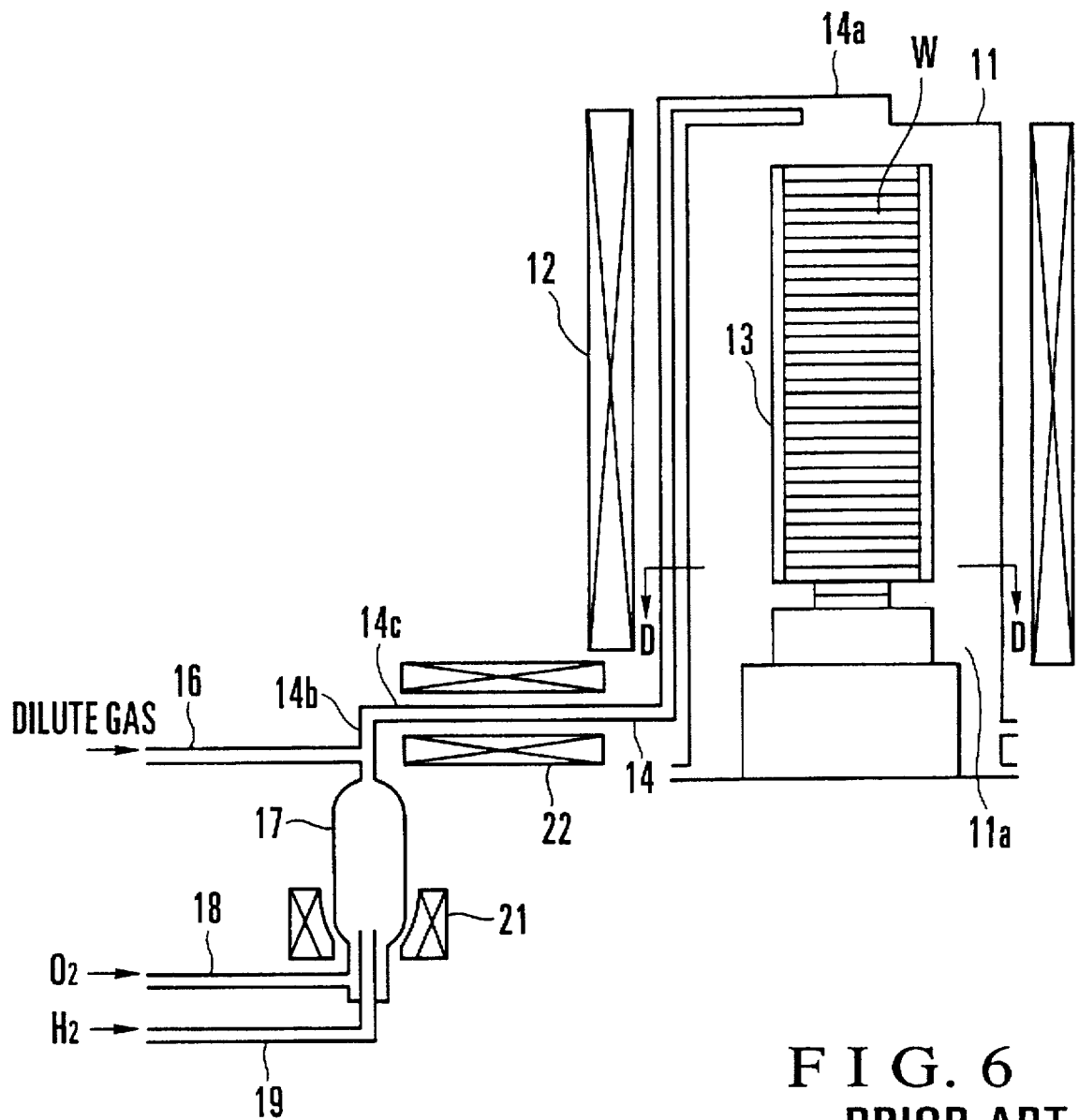
FIG. 6 is a view showing the schematic arrangement of the first conventional vertical external combustion oxidation apparatus.
Figure 7:
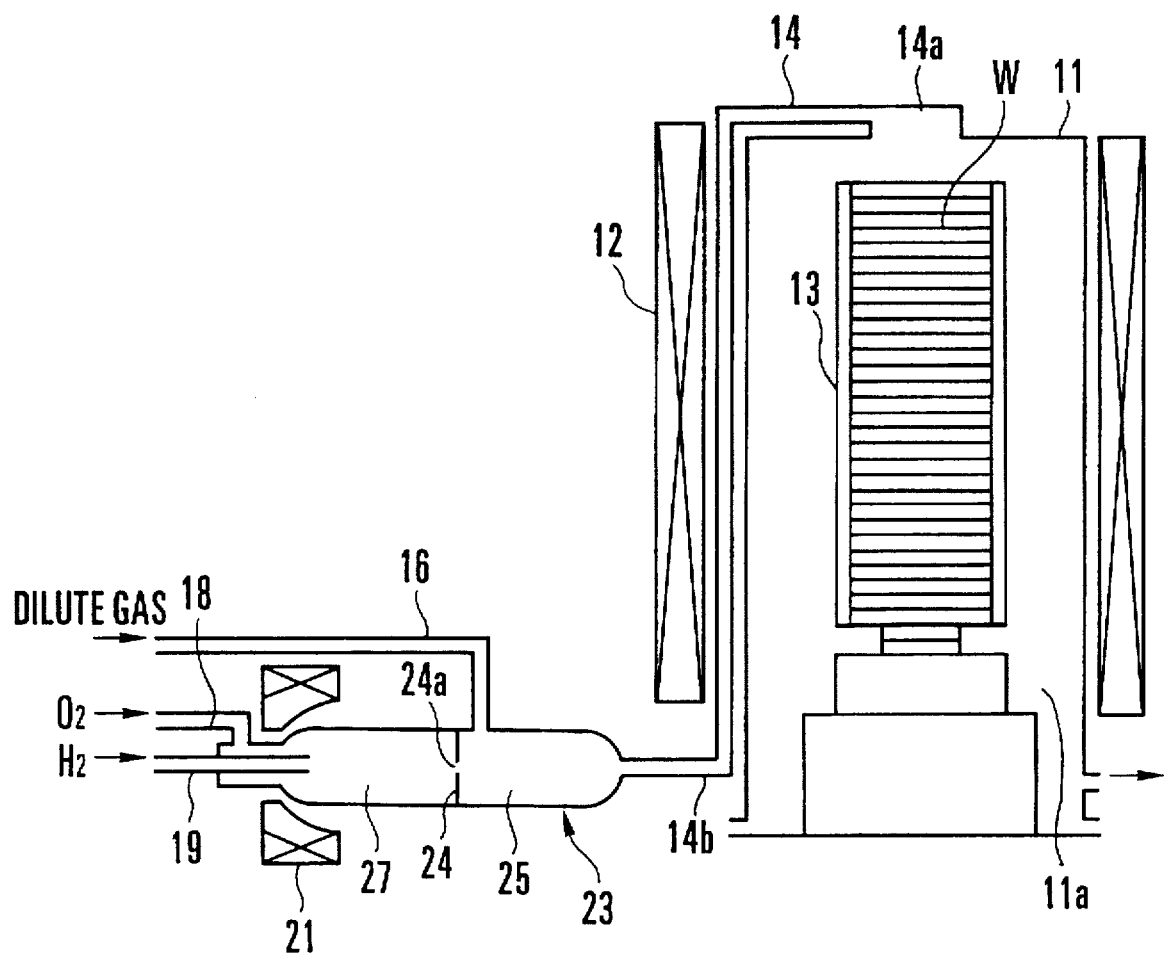
FIG. 7 is a view showing the schematic arrangement of the second conventional vertical external combustion oxidation apparatus.
Figure 8:
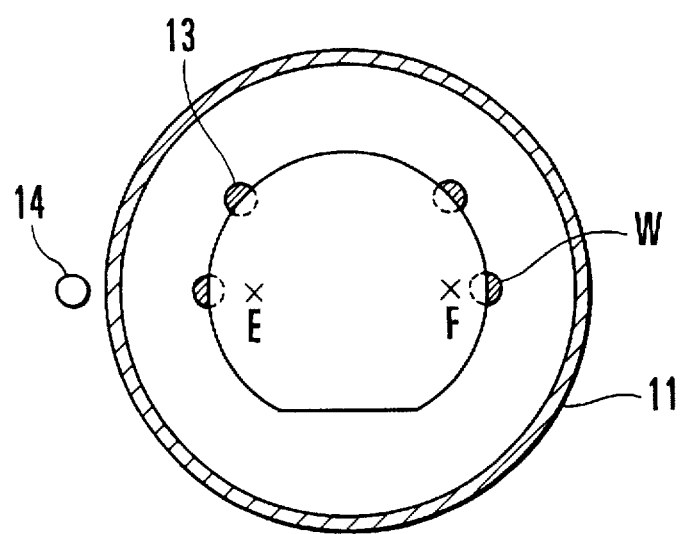
FIG. 8 is a sectional view taken along the line D—D of FIG. 6.
Figure 9:
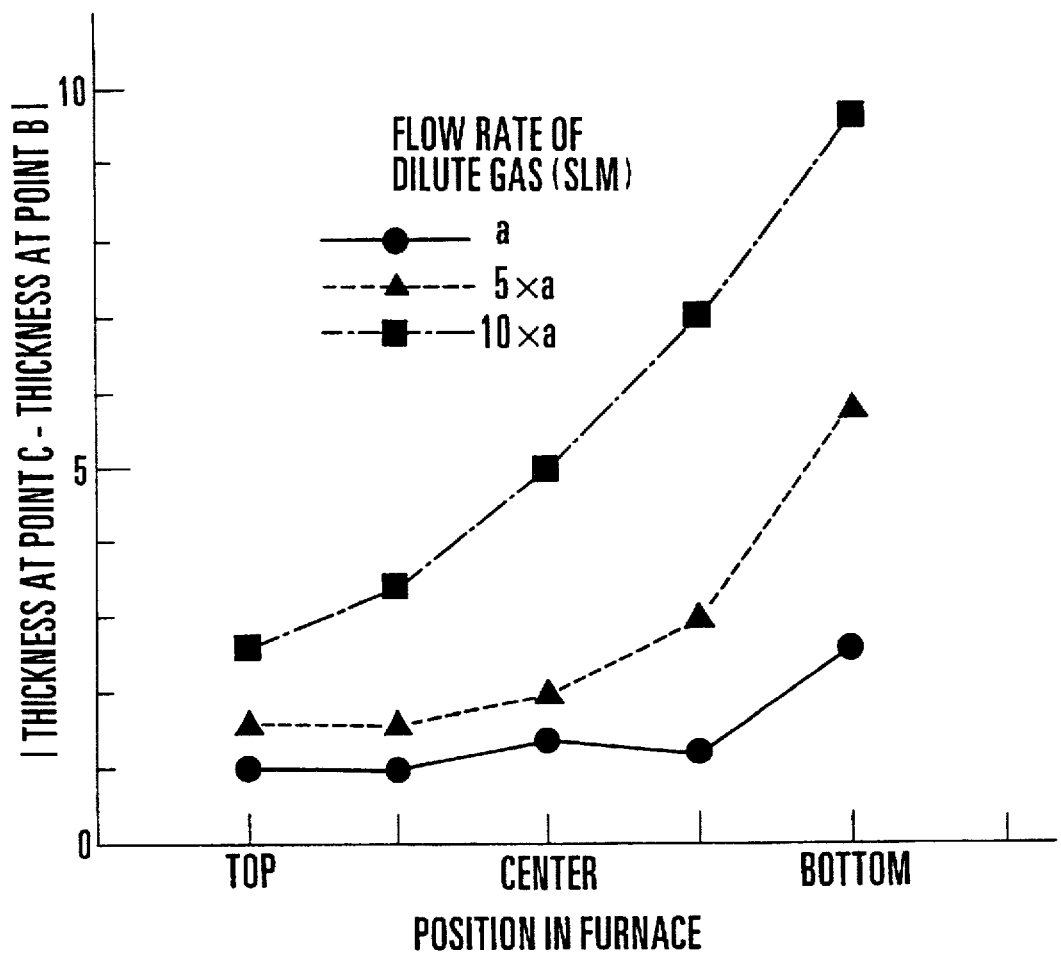
FIG. 9 is a graph showing a difference in thickness of the oxide film of a semiconductor wafer manufactured by the first conventional external combustion oxidation apparatus shown in FIG. 6.

FIG. 4 shows a modification of the external combustion oxidation apparatus shown in FIG. 1. The apparatus shown in FIG. 4 is different from the apparatus shown in FIG. 1 in that a combustion chamber 207 and a mixing chamber 205 are formed separately. The mixing chamber 205 is heated by a heater 121. The temperature in the mixing chamber 205 is controlled by a temperature detector 124 arranged at the lower portion in a furnace core tube 101, in the same manner as in the apparatus shown in FIG. 1. The temperature detector 124 detects the temperature in the furnace core tube 101. A temperature controller 122 controls the temperature in the mixing chamber 205 such that the temperature in the furnace core tube 101 becomes a desired oxidation temperature.

Water vapor and a dilute gas are supplied into the furnace core tube 101 so that they are heated to a predetermined oxidation temperature, and an oxide film having a uniform thickness is formed on a semiconductor wafer W in the furnace core tube 101.

Since the combustion chamber 207 and the mixing chamber 205 are physically separated from each other, as in the apparatus shown in FIG. 4, the limitation on the layout of the apparatus is eliminated. In addition, the mixing chamber 205 is not influenced by the temperature of the combustion chamber 207, so that the water vapor and dilute gas can be set to the predetermined oxidation temperature more accurately.

The present invention is not limited to the embodiment described above, and various changes and modifications may be made within the technical scope described in the appended claims. For example, the furnace core tube 101 can be applied to a horizontal external combustion oxidation apparatus which is installed horizontally. Various types of heat-resistant temperature detectors may be used as the temperature detector 124.

As has been described above, according to the present invention, the temperature in the furnace core tube is detected by the temperature detection means, and the heater that heats the mixing chamber is controlled by the temperature controller in accordance with the detected temperature. The temperature of the gas mixture flowing in the gas inlet tube does not influence the semiconductor wafer in the furnace core tube, and the temperature difference on each semiconductor wafer can be eliminated. As a result, the thickness difference on the oxide film formed on each semiconductor wafer can be decreased, thereby improving the yield of the semiconductor devices manufactured from the semiconductor wafer.

What is claimed is:

1. An external combustion oxidation apparatus comprising:

a furnace core tube which accommodates a semiconductor wafer in a gas mixture atmosphere of water vapor and a dilute gas and which is heated to a predetermined temperature to form an oxide film on the semiconductor wafer;

a mixing chamber for mixing water vapor and the dilute gas and supplying a gas mixture into said furnace core tube;

first heating means for heating said mixing chamber;

a gas inlet tube for connecting said mixing chamber and said furnace core tube to each other;

temperature detection means for detecting a temperature in said furnace core tube; and temperature control means for controlling a heating operation of said first heating means based on the temperature in said furnace core tube which is detected by said temperature detection means.

2. An apparatus according to claim 1, wherein said gas inlet pipe extends along an inner side surface of said furnace core tube to connect said mixing chamber and one end portion of said furnace core tube to each other, and said temperature detection means is arranged between said gas inlet tube in said furnace core tube and the semiconductor wafer.

3. An apparatus according to claim 2, wherein said temperature detection means is arranged at a lower portion in said furnace core tube near said gas inlet tube.

4. An apparatus according to claim 1, further comprising second heating means, arranged to surround said furnace core tube, for heating an interior of said furnace core tube to a predetermined temperature.

5. An apparatus according to claim 1, wherein said furnace core tube is arranged vertically, said gas inlet tube is connected to an upper portion in said furnace core tube, and the semiconductor wafer is loaded in and unloaded from said furnace core tube through a lower end portion of said furnace core tube.

6. An apparatus according to claim 1, further comprising a dilute gas supply tube for supplying a dilute gas into said mixing chamber, a combustion chamber for burning the gas mixture of hydrogen gas and oxygen gas, thereby supplying water vapor to said mixing chamber, an oxygen supply tube for supplying the oxygen gas to said combustion chamber, a hydrogen supply tube for supplying the hydrogen gas to said combustion chamber, and second heating means for heating an interior of said combustion chamber to a temperature not less than an ignition point of the hydrogen gas.

7. An apparatus according to claim 6, further comprising a vessel constituting said mixing chamber and said combustion chamber, and a partition plate that partitions said interior of said vessel into said mixing chamber and said combustion chamber and has a water vapor outlet port through which water vapor supplied from said combustion chamber to said mixing chamber flows.

8. An apparatus according to claim 6, wherein said mixing chamber and said combustion chamber are arranged physically separately.

* * * * *